United States Patent
Sundar et al.

(10) Patent No.: US 12,185,641 B2
(45) Date of Patent: Dec. 31, 2024

(54) SILICON OXYNITRIDE BASED ENCAPSULATION LAYER FOR MAGNETIC TUNNEL JUNCTIONS

(71) Applicant: TAIWAN SEMICONDUCTOR MANUFACTURING COMPANY, LTD., Hsinchu (TW)

(72) Inventors: Vignesh Sundar, Sunnyvale, CA (US); Yu-Jen Wang, San Jose, CA (US); Dongna Shen, San Jose, CA (US); Sahil Patel, Fremont, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 20 days.

(21) Appl. No.: 17/875,046

(22) Filed: Jul. 27, 2022

(65) Prior Publication Data
US 2022/0384718 A1    Dec. 1, 2022

Related U.S. Application Data

(60) Continuation of application No. 16/719,253, filed on Dec. 18, 2019, now Pat. No. 11,411,174, which is a
(Continued)

(51) Int. Cl.
*H01L 21/02*    (2006.01)
*C23C 16/30*    (2006.01)
(Continued)

(52) U.S. Cl.
CPC ........... *H10N 50/80* (2023.02); *C23C 16/308* (2013.01); *C23C 16/505* (2013.01); *G11C 11/15* (2013.01);
(Continued)

(58) Field of Classification Search
CPC ..... C23C 16/308; C23C 16/505; G11C 11/15; G11C 11/161; H01L 21/02126;
(Continued)

(56) References Cited

U.S. PATENT DOCUMENTS

| | | |
|---|---|---|
| 6,372,668 B2 | 4/2002 | Sun et al. |
| 6,864,150 B2 | 3/2005 | Lin et al. |

(Continued)

FOREIGN PATENT DOCUMENTS

| | | |
|---|---|---|
| CN | 101834240 A | 9/2010 |
| CN | 102854682 A | 1/2013 |

(Continued)

OTHER PUBLICATIONS

PCT Search Report, International Application No. PCT/US2018/035097, Applicant: Headway Technologies, Inc., dated Sep. 25, 2018, 15 pgs.

*Primary Examiner* — Asok K Sarkar
*Assistant Examiner* — Dmitriy Yemelyanov
(74) *Attorney, Agent, or Firm* — HAYNES AND BOONE, LLP

(57) ABSTRACT

A plasma enhanced chemical vapor deposition (PECVD) method is disclosed for forming a SiON encapsulation layer on a magnetic tunnel junction (MTJ) sidewall that minimizes attack on the MTJ sidewall during the PECVD or subsequent processes. The PECVD method provides a higher magnetoresistive ratio for the MTJ than conventional methods after a 400° C. anneal. In one embodiment, the SiON encapsulation layer is deposited using a $N_2O$:silane flow rate ratio of at least 1:1 but less than 15:1. A $N_2O$ plasma treatment may be performed immediately following the PECVD to ensure there is no residual silane in the SiON encapsulation layer. In another embodiment, a first (lower) SiON sub-layer has a greater Si content than a second
(Continued)

(upper) SiON sub-layer. A second encapsulation layer is formed on the SiON encapsulation layer so that the encapsulation layers completely fill the gaps between adjacent MTJs.

20 Claims, 3 Drawing Sheets

Related U.S. Application Data division of application No. 15/619,825, filed on Jun. 12, 2017, now Pat. No. 10,516,100.

(51) Int. Cl.
| | |
|---|---|
| *C23C 16/505* | (2006.01) |
| *G11C 11/15* | (2006.01) |
| *G11C 11/16* | (2006.01) |
| *H10B 61/00* | (2023.01) |
| *H10N 50/01* | (2023.01) |
| *H10N 50/80* | (2023.01) |

(52) U.S. Cl.
CPC ...... *G11C 11/161* (2013.01); *H01L 21/02126* (2013.01); *H01L 21/02274* (2013.01); *H10B 61/00* (2023.02); *H10N 50/01* (2023.02)

(58) Field of Classification Search
CPC .. H01L 21/02274; H10B 61/00; H10N 50/01; H10N 50/80; H10N 50/85
See application file for complete search history.

(56) References Cited

U.S. PATENT DOCUMENTS

| | | |
|---|---|---|
| 7,009,266 B2 | 3/2006 | Shi et al. |
| 8,455,965 B2 | 6/2013 | Li et al. |
| 8,456,883 B1 * | 6/2013 | Liu ................. H01L 21/823475 |
| | | 365/158 |
| 8,482,966 B2 | 7/2013 | Kang et al. |
| 8,980,649 B2 | 3/2015 | Ranjan et al. |
| 9,196,825 B2 | 11/2015 | Huang et al. |
| 9,230,571 B1 | 1/2016 | Chen et al. |
| 9,281,168 B2 | 3/2016 | Mudivarthi et al. |
| 9,362,490 B1 | 6/2016 | Xiao |
| 9,935,261 B1 | 4/2018 | Patel et al. |
| 10,439,132 B2 | 10/2019 | Iwata et al. |
| 10,516,100 B2 | 12/2019 | Sundar et al. |
| 2001/0044220 A1 | 11/2001 | Sun et al. |
| 2005/0167787 A1 | 8/2005 | Fricke et al. |
| 2013/0126995 A1 * | 5/2013 | Ogihara ................. H10N 50/10 |
| | | 257/E29.323 |
| 2013/0178046 A1 | 7/2013 | Hsieh et al. |
| 2015/0061052 A1 * | 3/2015 | Huang ................... H10N 50/01 |
| | | 257/421 |
| 2016/0028000 A1 | 1/2016 | Tsai et al. |
| 2016/0043306 A1 | 2/2016 | Huang et al. |
| 2017/0033282 A1 | 2/2017 | Wang et al. |
| 2017/0092847 A1 * | 3/2017 | Kim ..................... G11C 11/161 |
| 2017/0125668 A1 | 5/2017 | Paranjpe et al. |
| 2018/0159032 A1 * | 6/2018 | Park ..................... H10N 70/8413 |
| 2018/0269385 A1 | 9/2018 | Iwata et al. |
| 2018/0358545 A1 | 12/2018 | Sundar et al. |
| 2020/0127192 A1 | 4/2020 | Sundar et al. |

FOREIGN PATENT DOCUMENTS

| | | |
|---|---|---|
| JP | 2013110275 A | 6/2013 |
| KR | 20170038519 A | 4/2017 |
| WO | WO 2013/043330 | 3/2013 |
| WO | WO 2014/210613 | 12/2014 |

* cited by examiner

SILICON OXYNITRIDE BASED ENCAPSULATION LAYER FOR MAGNETIC TUNNEL JUNCTIONS

PRIORITY DATA

The present application is a continuation of U.S. patent application Ser. No. 16/719,253, filed Dec. 18, 2019, which is a divisional application of U.S. patent application Ser. No. 15/619,825, filed Jun. 12, 2017, each of which is herein incorporated by reference in its entirety.

TECHNICAL FIELD

The present disclosure relates to magnetic tunnel junctions (MTJs) in magnetic random access memory (MRAM), spin-torque MRAM, and other spintronic devices, and in particular to protecting MTJ sidewalls during processing steps including the deposition of an encapsulation layer that separates adjacent MTJs, and during high temperature annealing around 400° C. that is common in Complementary Metal Oxide Semiconductor (CMOS) fabrication.

BACKGROUND

A MTJ is a key component in MRAM, spin-torque MRAM, and other spintronic devices and comprises a stack with a tunnel barrier layer such as a metal oxide formed between two magnetic layers that provides a tunneling magnetoresistance (TMR) effect. One of the magnetic layers is a free layer and serves as a sensing layer by switching the direction of its magnetic moment in response to external fields while the second magnetic layer has a magnetic moment that is fixed and functions as a reference layer. The electrical resistance through the tunnel barrier layer (insulator layer) varies with the relative orientation of the free layer moment compared with the reference layer moment and thereby provides an electrical signal that is representative of a magnetic state in the free layer. In a MRAM, the MTJ is formed between a top conductor and bottom conductor. When a current is passed through the MTJ, a lower resistance (Rp) is detected when the magnetization directions of the free and reference layers are in a parallel state and a higher resistance is noted when they are in an anti-parallel state. The magnetoresistive ratio (DRR) may be expressed as $dR/R_P$ where dR is the difference in resistance between the two magnetic states. Since MTJ elements are often integrated in CMOS devices, the MTJ must be able to withstand annealing temperatures around 400° C. for about 30 minutes that are commonly applied to improve the quality of the CMOS units for semiconductor purposes.

Spin-torque (STT)-MRAM based technologies are desirable for nonvolatile memory applications. However, realizing low critical dimensions below 100 nm that match those found in Dynamic Random Access Memory (DRAM) is a challenge.

MTJs are highly susceptible to sidewall damage, both chemical and physical, induced by etching and deposition processes, and exacerbated by the CMOS process requirement of annealing at 400° C.

During fabrication of STT-MRAM devices, a MTJ nanopillar is typically defined by forming a pattern in an uppermost hard mask layer in the MTJ stack of layers, and then employing a physical etch (ion beam etch or IBE) or a chemical etch such as a reactive ion etch (RIE) with methanol to transfer the pattern through the MTJ stack thereby forming a plurality of MTJ nanopillars each with a critical dimension that is less than 100 nm for advanced devices. Subsequently, an encapsulation layer is deposited to electrically isolate MTJs from each other. The process flow of MTJ etching and encapsulation is a critical part of the CMOS integration flow and strongly influences the tunneling magnetoresistance ratio, especially for sub-100 nm device sizes.

The material and process selected to form the encapsulation layer around MTJ nanopillars must satisfy several criteria. In order to electrically isolate adjacent MTJs, the encapsulation layer must be a good dielectric material. Secondly, a tunnel barrier layer such as MgO is usually very hygroscopic which means the encapsulation layer should be an efficient moisture barrier. With regard to these two requirements, silicon based dielectric layers such as silicon oxide and silicon nitride have proven to be suitable encapsulation layer materials.

As spacial density of MRAM devices increases leading to a higher number of devices per unit area, the physical gap between adjacent MTJ nanopillars decreases. Therefore, a preferred encapsulation layer deposition method is one that provides excellent gap filling capability. In other words, highly conformal coatings provided by chemical vapor deposition (CVD) or atomic layer deposition (ALD) should be more suitable for such applications compared with physical vapor deposition (PVD) where shadowing effects are more severe.

In view of MRAM integration into CMOS technology, the encapsulation material needs to withstand exposure to 400° C. for two hours or more, and also protect the MTJ sidewall at these conditions.

There is a need to provide an encapsulation layer and process that meets all of the aforementioned requirements, especially for state of the art memory devices with a critical dimension of less than 100 nm.

SUMMARY

One objective of the present disclosure is to substantially improve the magnetoresistive ratio of a MTJ nanopillar by minimizing the exposure of MTJ sidewalls to reactive species during formation of an encapsulation layer that electrically isolates MTJ nanopillars from one another.

A second objective of the present disclosure is to provide a material that enables the encapsulation method of the first objective, and also satisfies the thermal stability, dielectric, moisture resistance, and gap filling requirements for MRAM devices that are integrated into CMOS technology.

According to one embodiment of the present disclosure, these objectives are achieved by providing a plurality of MTJ nanopillars on a substrate that may be a bottom electrode layer in a MRAM or STT-MRAM, for example. Adjacent MTJ nanopillars are separated from each other by gaps where each gap exposes a portion of the substrate top surface. Preferably, a first encapsulation layer that is silicon oxynitride ($SiO_xN_y$), where x and y are both>0, is conformally deposited on the substrate and on the plurality of MTJ nanopillars and their sidewalls to partially fill the gaps by a plasma enhanced CVD (PECVD) method. In other embodiments, an atomic layer deposition (ALD) technique, a CVD process method, or PVD process is employed to deposit the silicon oxynitride layer hereinafter expressed as SiON. Thereafter, a second encapsulation layer that is $Al_2O_3$, $SiO_2$, or other oxides, nitrides, oxynitrides, or carbonitrides used in the art to electrically isolate adjacent MTJ nanopillars is deposited on the first encapsulation layer and completely fills the gaps. Next, a chemical mechanical polish (CMP)

process is performed to remove an upper portion of the first and second encapsulation layers such that top surfaces thereof are coplanar with top surfaces of the MTJ nanopillars.

According to one embodiment, a critical feature is that the SiON layer is deposited with a PECVD process comprising a first step wherein there is a nitrous oxide ($N_2O$):silane flow rate ratio that is greater than 1:1, and less than 15:1. As a result, substantially all of the $N_2O$ is consumed during formation the SiON layer and thereby minimizes attack of reactive oxygen containing species on the MTJ sidewalls. Moreover, keeping the flow rate ratio above 1:1 minimizes the volume of unreacted silane in the SiON layer. An inert carrier gas including one or more of Ar, Kr, He, and Ne may also be fed into the PECVD deposition chamber during SiON deposition to enable a gas flow that sustains a plasma. The PECVD process typically comprises a temperature from 220° C. to 400° C., and a RF power from 100 to 1500 Watts to generate a plasma of reactive species that combine to form the SiON layer on the MTJ nanopillars.

In another embodiment, the PECVD process that forms the first encapsulation layer comprises two steps wherein a first SiON layer is deposited on the MTJ nanopillars with a PECVD step comprising a nitrous oxide ($N_2O$):silane flow rate ratio of between 1:1 and 5:1, and then a second SiON layer is formed on the first SiON layer with a second PECVD step having a $N_2O$:silane flow rate ratio greater than the first $N_2O$:silane flow rate ratio, and preferably greater than 5:1 and less than 15:1. The second step is performed immediately after the first step is completed and both steps comprise generating a plasma in a reaction chamber with a temperature from 220° C. to 400° C., a radio frequency (RF) power, and a noble gas flow. As a result, exposure of MTJ sidewalls to reactive oxygen and nitrogen species during formation of the first SiON layer is minimized, and the concentration of unreacted silane in the first encapsulation layer is minimized during deposition of the second SiON layer.

After a desired first encapsulation layer thickness is formed, the next step in the PECVD process is initiated wherein a $N_2O$ plasma treatment is performed. The $N_2O$ plasma treatment may be performed in the same process chamber where the first encapsulation layer is deposited. The present disclosure anticipates that after a first period of time has elapsed to complete the deposition of the first encapsulation layer, the first reactant flow rate is immediately stopped while the $N_2O$ flow rate and resulting plasma treatment continues for a second period of time. The $N_2O$ plasma treatment is advantageously used to ensure that residual silane in the first encapsulation layer is consumed. Furthermore, the first encapsulation layer is believed to become more dense during the second step thereby preventing reactive species formed in a subsequent deposition of the second encapsulation layer from penetrating the first encapsulation layer and attacking MTJ sidewalls. Since the first encapsulation layer only partially fills the gaps between adjacent MTJs, the second encapsulation layer is employed to completely fill the gaps.

After a CMP process planarizes the first and second encapsulation layers, a top electrode layer is formed such that a conductive line in the top electrode layer contacts a top surface of each MTJ nanopillar in a row or column in the memory array. The completed memory structure may be a MRAM, STT-MRAM, or a spintronic device such as a spin torque oscillator (STO). In a STO device, the substrate may be a main pole layer that serves as a bottom electrode, and the top electrode may be a trailing shield, for example.

DETAILED DESCRIPTION

Figure 1:
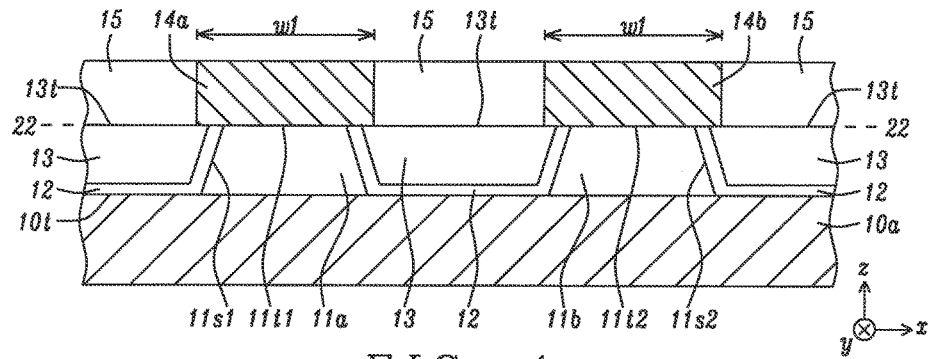
FIG. 1 is a cross-sectional view that depicts a memory structure having first and second encapsulation layers formed on MTJ sidewalls, and deposited by a PECVD process according to an embodiment of the present disclosure.

The present disclosure relates to an improved encapsulation layer comprised of SiON that adjoins MTJ nanopillars, and in particular, to a process for depositing the same that substantially minimizes damage to MTJ sidewalls and thereby yields a higher magnetoresistive ratio, especially for critical dimensions of 100 nm or less.

The MTJ nanopillars may be formed in a variety of memory devices including but not limited to MRAM, spin-torque MRAM, and other spintronic devices such as a spin torque oscillator (STO). In the drawings, a thickness of a layer is in the z-axis direction, and the plane of each layer is formed in the x-axis and y-axis directions.

As indicated earlier, encapsulation materials such as silicon oxide and silicon nitride that are deposited by excellent gap filling methods such as CVD, or with a less thermally stringent PECVD process, satisfy several requirements including serving as an efficient moisture barrier, providing excellent dielectric properties, and having thermal stability to 400° C. However, we observe that precursor materials used for depositing silicon oxide and silicon nitride are highly reactive and readily attack MTJ sidewalls. For example, silicon nitride deposition uses silane and ammonia, and we found that exposure of MTJ sidewalls to reactive ammonia species significantly reduces the magnetoresistive ratio (DRR) of the MTJ nanopillars. Similarly, silicon oxide deposition employs silane and nitrous oxide ($N_2O$) where a large volume of $N_2O$ relative to that of silane is necessary.

As a result, MTJ sidewalls are easily oxidized by an abundance of reactive oxygen containing species.

Although silicon oxynitride is also deposited with silane and $N_2O$ precursors, we have discovered that by limiting the flow rate of $N_2O$ relative to that of silane, DRR is substantially improved over prior art methods, especially for MTJ sizes less than 100 nm. Moreover, a $N_2O$ plasma treatment may follow the SiON deposition to ensure that essentially no unreacted silane remains in the film. It is believed that with a $N_2O$/silane flow rate ratio below 15:1, a considerable amount of unreacted silane may remain in the SiON layer, and during subsequent processing, residual silane reacts with a tunnel barrier layer such as MgO thereby lowering DRR.

Referring to FIG. 1, a first embodiment of the present disclosure is shown wherein a memory device comprises a plurality of MTJ nanopillars hereafter called MTJs including MTJ 11a and MTJ 11b that have sidewalls 11s1 and 11s2, respectively, and adjoin a first encapsulation layer 12. MTJ 11a is formed between a bottom electrode 10a and a top electrode 14a while MTJ 11b contacts bottom electrode 10a and top electrode 14b. Second encapsulation layer 13 is formed on the first encapsulation layer and fills a majority of the space (gap) between adjacent MTJ nanopillars. The stack of first and second layers 12, 13 is considered a bilayer configuration for the encapsulation layer that is also referred to as a passivation layer. The bottom electrode is a line that extends along the x-axis, and the top electrodes are lines that extend in the y-axis direction in a MRAM or STT-MRAM embodiment. Bottom and top electrodes are typically comprised of one or more metals or alloys to ensure excellent electrical conductivity and resistance to oxidation. There is an insulation layer 15 formed on a substantial portion of second encapsulation layer top surface 13t. Within the insulation layer is a top electrode layer comprised of top electrodes including 14a, 14b. Note that each of the top electrodes may have a width w1 that is greater than a width of top surfaces 11t1, and 11t2. In other words, an outer portion of the top electrodes may overlay on the first encapsulation layer and on a portion of the second encapsulation layer.

It should be understood that typically millions of MTJs are aligned in rows and columns in a memory array on a substrate, and each MTJ is formed between a bottom electrode and a top electrode. However, the number of MTJs shown in FIG. 1 is limited to two in order to simplify the drawing. The MTJs may have a variety of configurations but each MTJ has at least a tunnel barrier layer formed between a reference layer (RL) and free layer (FL) in a RL/tunnel barrier/FL or FL/tunnel barrier/RL stack on a substrate (not shown) that is a seed layer, for example.

First encapsulation layer 12 contacts not only MTJ sidewalls 11s1 and 11s2, and other MTJ sidewalls that are not depicted, but also adjoins portions of top surfaces of bottom electrodes such as top surface 10t of bottom electrode 10a that are not covered by MTJs. Preferably, the first encapsulation layer has a uniform (conformal) thickness from 10 to 200 Angstroms. According to one aspect, the first encapsulation layer is $SiO_XN_Y$ where each of x and y is >0, and which is deposited by a PECVD process or the like that minimizes exposure of MTJ sidewalls to reactive oxygen species, and significantly reduces the amount of unreacted silane in the deposited SiON layer.

In a preferred embodiment, first encapsulation layer 12 is deposited by a PECVD method that is performed in a reaction chamber at a temperature from 220° C. to 400° C. The PECVD process may be "in-situ" in that it is performed in the same mainframe that was used to etch MTJ sidewalls 11s1, 11s2. For example, the mainframe may have a first reaction chamber for the MTJ etch process, and an adjacent second reaction chamber for PECVD that is linked to the first reaction chamber by a track system maintained under an inert atmosphere to exclude oxygen. The track system is used to transport wafers from one chamber to another chamber in the mainframe. Alternatively, the PECVD process is ex-situ wherein the first encapsulation layer deposition occurs in a different tool outside of a mainframe in which the MTJ etch process occurred. Although a CVD process could be employed for forming the first encapsulation layer, CVD usually comprises a temperature considerably higher than 400° C. that could damage one or more layers in the MTJ nanopillars. Alternatively, PVD or ALD could be selected to deposit the first encapsulation layer. However, the former typically does not provide the necessary gap filling capability while ALD deposition is slower than PECVD and may undesirably lengthen throughput time.

In one preferred embodiment, the PECVD process is performed with a mixture of silane and nitrous oxide ($N_2O$) as reactants. Furthermore, a critical feature is providing a $N_2O$/silane flow rate ratio of at least 1:1, and preferably greater than 5:1 but less than 15:1. In some embodiments, the N2O flow rate is maintained in the range of 110 to 500 standard cubic centimeters per minute (sccm) to provide a SiON (first encapsulation layer) thickness of 10 to 200 Angstroms during a period of 3 to 60 seconds. It should be understood that with a $N_2O$:silane flow rate ratio of 15:1 or greater, a considerable amount of $SiO_2$ is formed in the deposited film, and the concentration of excess reactive oxygen species during deposition is sufficiently high to pose a significant risk of attack on MTJ sidewalls. In the prescribed flow rate ratio range, essentially all of the nitrous oxide is consumed during formation of SiON, which leaves a relatively small volume of reactive oxygen species, if any, to oxidize MTJ sidewalls. Furthermore, the amount of unreacted silane residing in the deposited SiON layer is minimized in the prescribed flow rate ratio range to avoid a threat of a subsequent reaction of residual silane that could reduce the oxidation state in an adjoining tunnel barrier layer in the MTJ nanopillars. Accordingly, DRR for the encapsulated MTJs is improved compared with conventional deposition processes that employ a silane:$N_2O$ flow rate ratio outside of the prescribed range disclosed herein.

Figure 2:
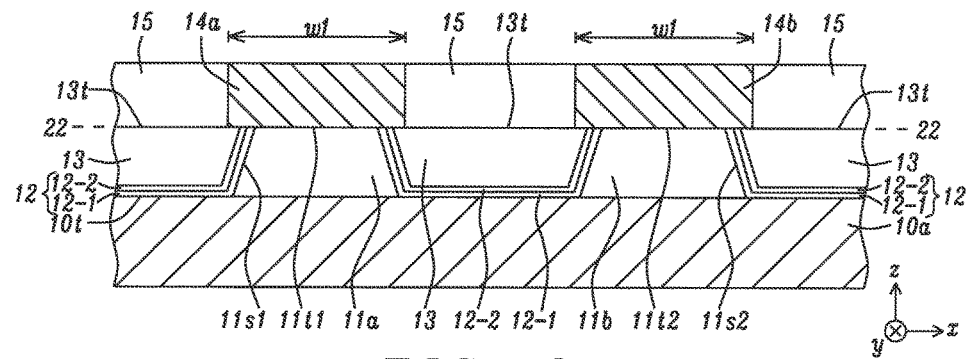
FIG. 2 is a cross-sectional view that illustrates a second embodiment of the present disclosure wherein the first encapsulation layer in FIG. 1 is modified to include two SiON sub-layers.

In another embodiment depicted in FIG. 2, the first encapsulation layer 12 comprises two SiON sub-layers each formed by different PECVD conditions. A first PECVD step is employed to deposit a first SiON sub-layer 12-1 by using a first $N_2O$:silane flow rate ratio between 1:1 and 5:1. Immediately after the first SiON sub-layer is laid down, a second PECVD step in the same chamber is performed to deposit a second SiON sub-layer 12-2 with a second $N_2O$:silane flow rate ratio that is greater than the first $N_2O$:silane flow rate ratio, and preferably greater than a 5:1 flow rate ratio, but where the $N_2O$ flow rate is less than 15 times the silane flow rate. Both PECVD steps generate a plasma with a temperature from 220° C. to 400° C., a radio frequency (RF) power, and a noble gas flow in addition to the $N_2O$ and silane flows. The first and second sub-layers have a combined thickness of 10 to 200 Angstroms. The first sub-layer has a $Si_{x1}O_{y1}N_{z1}$ composition and the second sub-layer has a $Si_{x2}O_{y2}N_{z2}$ composition where $x_1$ and $x_2$ are the Si content in the first and second sub-layers, respectively, and $x_1$ is unequal to $x_2$. Preferably, $x_1$ is greater than $x_2$ as a result of a higher silane content in the gas mixture used during deposition of the first SiON sub-layer.

After a desired thickness of the first encapsulation layer 12 is achieved, the PECVD process immediately continues to a second step in the same reaction chamber. In particular, the silane flow rate is terminated while all other conditions including temperature, RF power, and $N_2O$ flow rate are maintained from the first step for an additional period of time of 3 to 20 seconds. In some embodiments, the RF power during the $N_2O$ plasma treatment may be reduced to a minimum of 25 Watts from a minimum of 100 Watts in the first step. Although not bound by theory, it is believed that during the second step, $N_2O$ plasma is advantageously used to react with residual silane in the first encapsulation layer to prevent a subsequent reaction of residual silane with the tunnel barrier layer. Also, the first encapsulation layer is believed to become denser as a result of the $N_2O$ plasma treatment thereby generating a more impervious barrier to reactive species during the subsequent step of depositing the second encapsulation layer 13 on the first encapsulation layer. Accordingly, a first encapsulation layer with higher density offers improved protection against attack by reactive oxygen species and the like on MTJ sidewalls.

In all of the aforementioned embodiments, the PECVD process used to deposit the first encapsulation layer 12 comprises a RF power of 100 to 1500 Watts and a chamber pressure from 4 to 6 torr. The present disclosure also anticipates the addition of a noble carrier gas such as Ar, Kr, Ne, or He to transport the silane and $N_2O$ precursors into the reaction chamber. The advantage of including the noble carrier gas is to provide a sufficient flow of materials in order to maintain a plasma in the reaction chamber.

The second encapsulation layer 13 is typically a metal oxide, metal carbide, metal nitride, metal oxynitride, or metal carbonitride such as $SiO_vN_w$, $AlO_vN_w$, $TiO_vN_w$, $SiC_vN_w$, or MgO or any combination of the aforementioned materials where v+w>0. The second encapsulation layer has a thickness up to about 2000 Angstroms and is typically thicker than the first encapsulation layer. In some embodiments, the second encapsulation layer has a faster deposition rate than the first encapsulation layer and is relied upon to fill gaps between adjacent MTJs that remain after the first encapsulation layer is laid down. Usually, the second encapsulation layer fills a major portion of the gaps between adjacent MTJ nanopillars in view of having a greater thickness than the first encapsulation layer.

Figure 3:
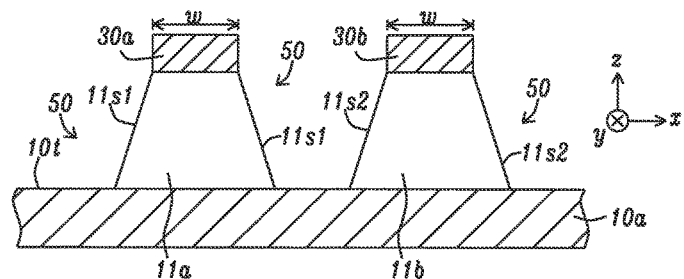
FIG. 3 is a cross-sectional view that shows a step of forming a MTJ nanopillar structure by using a masking layer during an etching process according to an embodiment of the present disclosure.

Referring to FIG. 3, a process of forming a plurality of MTJs in a memory array is depicted. A photoresist layer is formed on the MTJ stack of layers and is patterned by a well known photolithography technique to give a plurality of islands including photoresist islands 30a, 30b each having a width w. Subsequently, a conventional reactive ion etch (RIE), an ion beam etch (IBE) process, or a combination of a chemical etch (RIE) and physical etch (IBE) called RIBE is performed to remove regions of the MTJ stack of layers that are not protected by a photoresist island. Note that the photolithography process yields an array of photoresist islands laid out in rows and columns such that each island serves as an etch mask. Furthermore, the RIE, IBE, or RIBE process may include a plurality of steps and generates a MTJ sidewall below each etch mask. Thus, MTJ 11a and MTJ 11b are formed with sidewalls 11s1 and 11s2, respectively, below islands 30a and 30b, and there are gaps 50 on each side of the MTJs that expose portions of bottom electrode top surface 10t. In the exemplary embodiment, the RIE, IBE, or RIBE process forms non-vertical sidewalls 11s1 and 11s2 such that a bottom of each MTJ at top surface 10t has a greater width than w. However, depending on the MTJ etch conditions, substantially vertical MTJ sidewalls may be produced.

Figure 4:
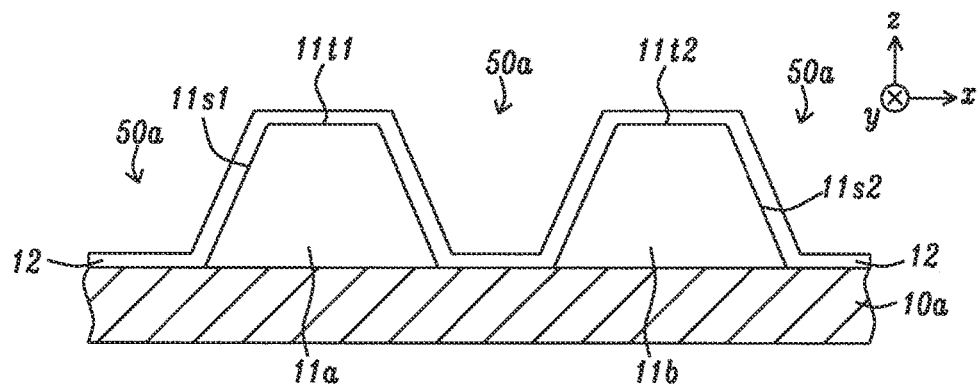
FIG. 4 is a cross-sectional view depicting the partially formed memory structure in FIG. 3 after a PECVD process is used to deposit the first encapsulation layer according to an embodiment of the present disclosure.

Referring to FIG. 4, a conventional process is employed to remove photoresist islands 30a, 30b. Then, first encapsulation layer 12 is deposited on top surface 10t and on the array of MTJs including top surfaces 11t1 and 11t2, and sidewalls 11s1 and 11s2 of MTJ 11a and MTJ 11b, respectively, according to a process that was previously described. In a preferred embodiment, the PECVD deposition process is substantially conformal such that a uniform thickness of first encapsulation layer is formed on the MTJ top surfaces and on MTJ sidewalls.

Figure 5:
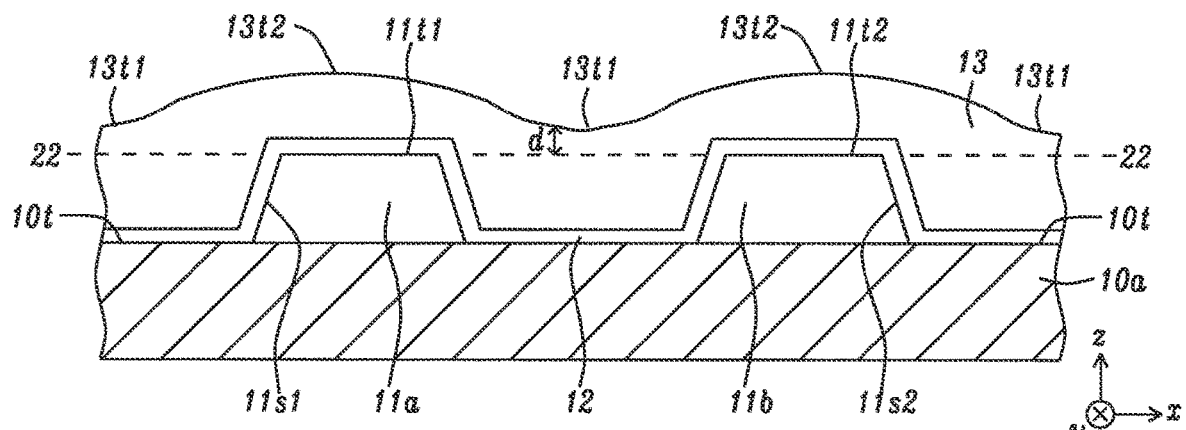
FIG. 5 is a cross-sectional view depicting the partially formed memory structure in FIG. 4 after a second encapsulation layer is deposited to cover a plurality of MTJ nanopillars according to an embodiment of the present disclosure.

In FIG. 5, the partially formed memory structure in FIG. 4 is depicted after the second encapsulation layer 13 is deposited by a PECVD or CVD process on the first encapsulation layer 12. ALD or PVD methods may be selected for this step but are generally associated with a lengthy deposition time or poor gap filling capability, respectively. The top surface of the second encapsulation layer has topography in view of multiple maximum points 13t2 above the MTJs 11a, 11b, and a plurality of minimum points 13t1 about midway between the maximum points. Minimum points are a distance d>0 above plane 22-22 that includes top surfaces 11t1, 11t2 of the MTJs. In other words, the first and second encapsulation layers completely fill gaps 50 between adjacent MTJs 11a, 11b.

Figure 6:
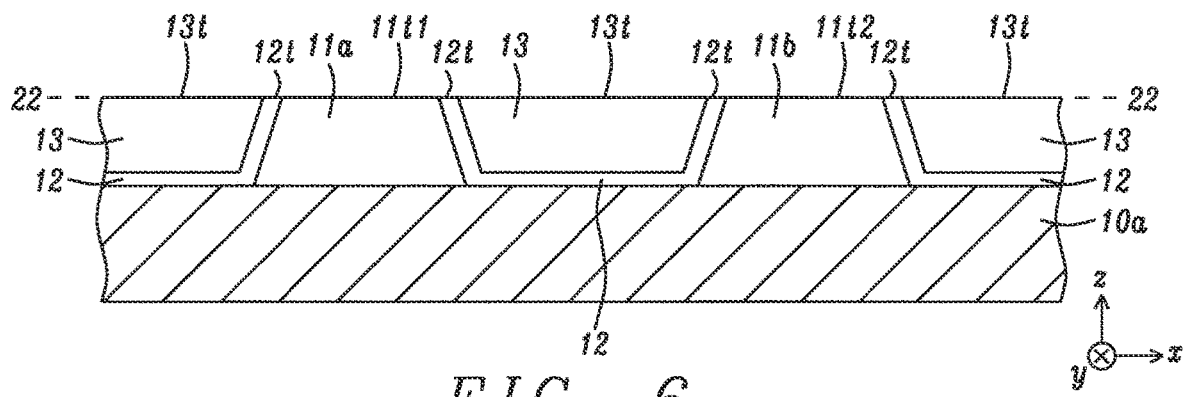
FIG. 6 is a cross-sectional view of the intermediate structure in FIG. 5 after a chemical mechanical polish (CMP) process is performed to form a planar top surface on the second encapsulation layer according to an embodiment of the present disclosure.

Referring to FIG. 6, a well known chemical mechanical polish (CMP) process is performed to remove an upper portion of the encapsulation layer with the bilayer configuration such that the partially formed memory device has a top surface along plane 22-22 that includes first encapsulation layer top surface 12t, second encapsulation layer top surface 13t, and top surfaces 11t1 and 11t2 of MTJ 11a and MTJ 11b, respectively. In some embodiments, the uppermost MTJ layer is a hard mask such as MnPt with a top surface that is 11t1 or 11t2. In other embodiments, the uppermost MTJ layer is a capping layer that is one or more of SiN, TiN, Ta, Ti, W, or Ru such as a Ru/Ta/Ru configuration, for example.

Returning to the first embodiment in FIG. 1 or the second embodiment in FIG. 2, a subsequent sequence of steps well known in the art is followed and includes photoresist patterning and etch processes that are used to form a top electrode layer with top electrodes 14a, 14b within insulation layer 15 wherein top electrode 14a adjoins the top surface of MTJ 11a, and top electrode 14b contacts the top surface of MTJ 11b. As mentioned previously, the top electrode layer typically comprises a plurality of top electrodes formed in an array of parallel lines, for example, but only two top electrodes are shown in the exemplary embodiment. The insulation layer may be silicon oxide or alumina, or other dielectric materials that are used in the art to electrically isolate adjacent conductive elements, and has a bottom surface at plane 22-22.

Figure 7:
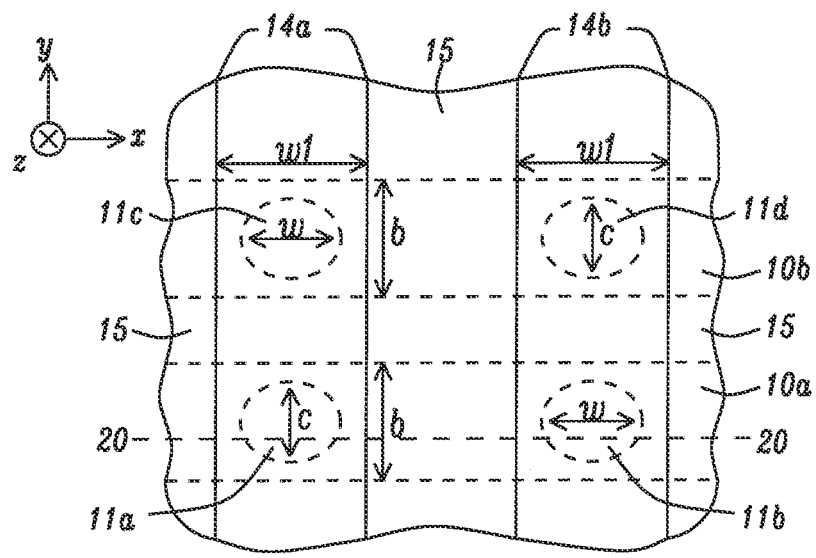
FIG. 7 is a top-down view of the memory structure in FIG. 1 that shows an array of MTJ nanopillars formed in rows and columns according an embodiment of the present disclosure.

Referring to FIG. 7, a top-down view of the memory structure in FIG. 1 (or FIG. 2 is depicted. Plane 20-20 indicates the location where the cross-sectional views in FIG. 1 (or FIG. 2) is taken. In the exemplary embodiment where an additional two MTJs 11c and 11d are shown between a second bottom electrode 10b and top electrodes 14a, 14b, respectively, the width w1 of the top electrodes is preferably greater than the width w of the MTJs 11a-11d. Also, a length b of the bottom electrodes 10a, 10b in the y-axis direction is typically greater than the length c of the MTJs. The MTJs have a substantially circular shape that is a circle or ellipse. In other embodiments, the MTJs may have a polygonal shape such as a square or rectangle.

Figure 8:
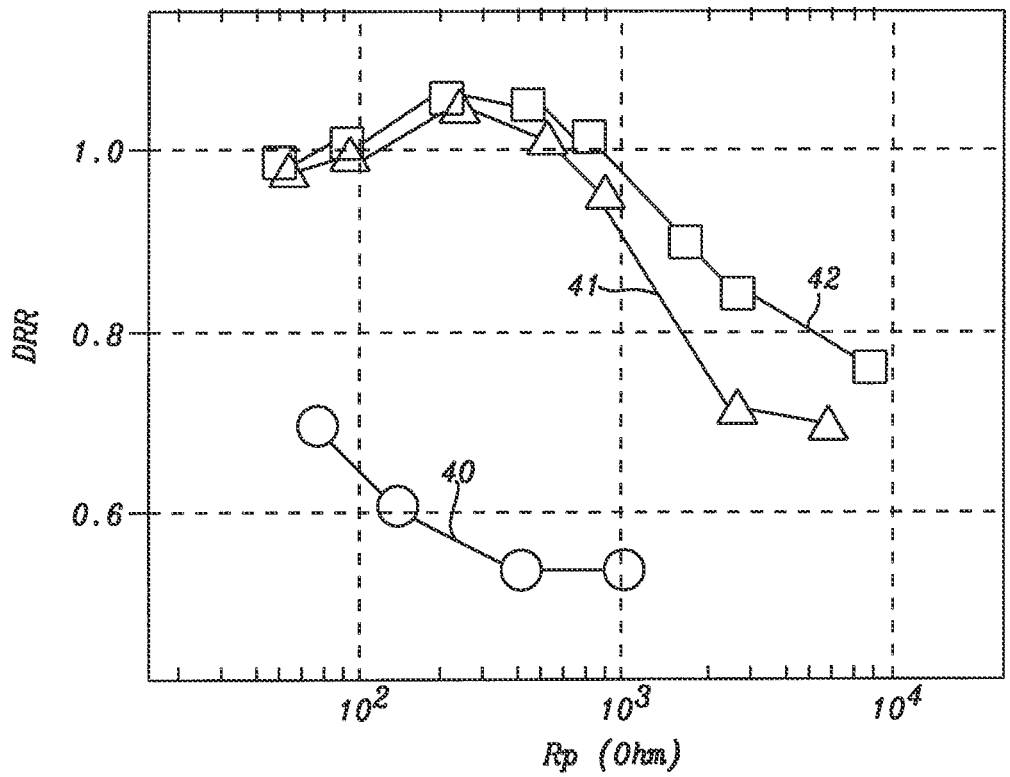
FIG. 8 is a plot of magnetoresistive ratio (DRR) as a function of Rp that is related to MTJ size, and shows improved performance when a first encapsulation layer is formed according to an embodiment of the present disclosure.

Referring to FIG. 8, an experiment was conducted to demonstrate the improved performance achieved by depositing a SiON first encapsulation layer to protect adjoining MTJ nanopillars according to an embodiment of the present disclosure. A series of MTJ nanopillars was fabricated in a circular shape (w=c in FIG. 7) on wafers wherein the MTJ diameter w was varied from around 30 nm to 300 nm on each wafer. With a first set of wafers that serve as a reference sample, a first encapsulation layer with a 200 Angstrom thickness and made of silicon oxide was deposited by a conventional PECVD method using a silane flow rate of 260 sccm, a $N_2O$ flow rate of 3900 sccm, and a RF power of 300 Watts to partially fill the gaps between adjacent MTJs. Thereafter, a second encapsulation layer made of silicon nitride with a 2000 Angstrom thickness was deposited to fill the gaps. Then, a CMP process was performed, and a top electrode layer was formed within an insulation layer to yield a memory structure similar to that shown in FIG. 1. The completed memory structure was annealed at 400° C. prior to DRR measurements.

A second set of wafers having the same series of MTJ sizes mentioned previously, and that also serves as a reference was processed with a flow sequence similar to the first set of wafers except that the first encapsulation layer was a 200 Angstrom thick silicon nitride layer deposited by a conventional PECVD method using a 220 sccm silane flow rate, a 75 sccm $NH_3$ flow rate, a 5000 sccm $N_2$ flow rate, and a RF power of 450 Watts to partially fill the gaps between adjacent MTJs.

Finally, with a third set of wafers and the same series of MTJ sizes, the process flow of the first and second set of wafers was followed except the first encapsulation layer was SiON, and deposited according to an embodiment of the present disclosure. In particular, the PECVD process employed a 110 sccm silane flow rate, a 210 sccm $N_2O$ flow rate, a 3800 sccm He flow rate, a pressure of 5.5 torr, and a RF power of 120 Watts. Each of the PECVD processes that were used to deposit the first encapsulation layers in the three sets of wafers was performed at 400° C. With the third set of wafers, a $N_2O$ plasma treatment was applied for 20 seconds at 400° C. with a 2000 sccm $N_2O$ flow, 4.8 Torr pressure, and a RF power of 200 Watts immediately after the SiON first encapsulation layer was deposited. Thus, each of the three sets of wafers had a 2000 Angstroms thick second encapsulation layer made of silicon nitride formed on a 200 Angstroms thick first encapsulation layer. DRR measurements were obtained with an Accretech UF300A prober at 25° C.

Results in FIG. 8 show that the series of MTJs 40 on the first set of wafers with a silicon oxide encapsulation layer exhibited the lowest DRR values. The series of MTJs 41 on the second set of wafers with a silicon nitride encapsulation layer provided a large improvement over the first series. However, the series of MTJs 42 on the third set of wafers with a $SiO_XN_Y$ first encapsulation layer deposited according to a method of the present disclosure, yielded the highest DRR values, especially for MTJ sizes proximate to 100 nm and below that correspond to Rp values between $10^3$ and $10^4$ Ohms.

The SiON encapsulation layer that is deposited by the PECVD process disclosed herein is expected to satisfy all of the requirements for an encapsulation layer employed in state of the art memory structures. In addition to having excellent gap filling capability, a low dielectric constant, and serving as an efficient moisture barrier, the first encapsulation layer has essentially no residual silane and is deposited with a process that enables an improved capacity to protect MTJ sidewalls from reactive species during formation of the first and second encapsulation layers.

While this disclosure has been particularly shown and described with reference to, the preferred embodiment thereof, it will be understood by those skilled in the art that various changes in form and details may be made without departing from the spirit and scope of this disclosure.

What is claimed is:

1. A magnetic device, comprising:
a first magnetic tunnel junction (MTJ);
a second MTJ adjacent to the first MTJ;
a bottom electrode comprising a metal or a metal alloy and extending continuously from under the first MTJ to under the second MTJ;
a first top electrode disposed on the first MTJ;
a first encapsulation layer disposed on sidewalls of the first MTJ and the second MTJ, the first encapsulation layer including:
a first sub-layer extending along a sidewall of the first MTJ from a top surface of the first MTJ to a top surface of the bottom electrode and along a sidewall of the second MTJ from a top surface of the second MTJ to the top surface of the bottom electrode, the first sub-layer having a $Si_{x1}O_{y1}N_{z1}$ composition, wherein the first sub-layer physically contacts the top surface of the bottom electrode, the top surface of the bottom electrode facing the first top electrode, wherein Y1 and Z1 are greater than zero; and
a second sub-layer lining the first sub-layer, the second sub-layer having a $Si_{x2}O_{y2}N_{z2}$ composition, wherein Y2 and Z2 are greater than zero and X1 is different than X2; and
a second encapsulation layer disposed directly on the first encapsulation layer between the first MTJ and the second MTJ, the second encapsulation layer formed of a different material than the first encapsulation layer, wherein the second encapsulation layer includes a material selected from the group consisting of a metal oxide, metal carbide, metal nitride, metal oxynitride and metal carbonitride.

2. The magnetic device of claim 1, wherein X1 is greater than X2.

3. The magnetic device of claim 1, wherein the first sub-layer interfaces with the first MTJ and the second MTJ.

4. The magnetic device of claim 1, wherein the second sub-layer interfaces with the first sub-layer, and
wherein the second encapsulation layer interfaces with the second sub-layer.

5. The magnetic device of claim 1, wherein the first encapsulation layer has a thickness ranging from about 10 Å to about 200 Å.

6. The magnetic device of claim 1,
wherein top surfaces of the first MTJ, the second MTJ, the first encapsulation layer, and the second encapsulation layer are coplanar,
wherein the first top electrode interfaces with the first and second encapsulation layers.

7. The magnetic device of claim 1, wherein the first MTJ includes a reference layer, a tunnel barrier layer and a free layer.

8. The magnetic device of claim 1, further comprising:
a second top electrode disposed over and interfacing with the second MTJ; and a dielectric layer disposed between the first top electrode and the second top electrode and interfacing with the second encapsulation layer.

9. A device comprising:
a first stack of magnetic tunnel junction (MTJ) layers and a second stack of MTJ layers disposed over a first electrode;
a first encapsulation layer extending between the first stack of MTJ layers and the second stack of MTJ layers, the first encapsulation layer including:
a first SiON layer physically contacting the first stack of MTJ layers and the second stack of MTJ layers, the first SiON layer having a first concentration of silicon; and
a second SiON layer disposed on the first SiON layer, the second SiON layer having a second concentration of silicon that is different than the first concentration of silicon; and
a second encapsulation layer disposed on the first encapsulation layer between the first stack of MTJ layers and the second stack of MTJ layer, wherein the second encapsulation layer includes a material selected from the group consisting of a metal carbide, a metal nitride, a metal oxynitride and a metal carbonitride,
wherein the first electrode comprises a conductive line extending continuously from a bottom surface of the first stack of MTJ layers to a bottom surface of the second stack of MTJ layers,
wherein a topmost surface of the first electrode is planar.

10. The device of claim 9, further comprising a second electrode disposed on the first stack of MTJ layers and a third electrode disposed on the second stack of MTJ layers, and
wherein the second and third electrodes physically contact the first SiON layer, the second SiON layer and the second encapsulation layer.

11. The device of claim 10, further comprising an insulating layer extending from the second electrode to the third electrode and physically contacting the second encapsulation layer.

12. The device of claim 11, wherein the insulation layer, the second electrode and the third electrode extend to the same height above the first electrode.

13. The device of claim 9, wherein each of the first stack of MTJ layers and the second stack of MTJ layers comprises a circular shape in a top view.

14. The device of claim 9, wherein the first SiON layer physically contacts the topmost surface of the first electrode.

15. The device of claim 14, wherein the second SiON layer is separated from the first electrode by the first SiON layer.

16. A device comprising:
a first stack of magnetic tunnel junction (MTJ) layers and a second stack of MTJ layers disposed over a first electrode, wherein the first stack of MTJ layers are spaced apart from the second stack of MTJ layers;
a first SiON layer physically contacting the first stack of MTJ layers and the second stack of MTJ layers, the first SiON layer having a $Si_{x1}O_{y1}N_{z1}$ composition, Y1 and Z1 being greater than zero;
a second SiON layer disposed on the first SiON layer, the second SiON layer having a $Si_{x2}O_{y2}N_{z2}$ composition, Y2 and Z2 being greater than zero and X1 being greater than X2; and
a metal containing layer disposed on the second SiON layer between the first stack of MTJ layers and the second stack of MTJ layers, wherein the metal containing layer includes a material selected from the group consisting of a metal carbide, a metal nitride, a metal oxynitride and a metal carbonitride,
wherein the first electrode comprises a planar top surface that extends continuously from a bottom surface of the first stack of MTJ layers to a bottom surface of the second stack of MTJ layers.

17. The device of claim 16, wherein wherein top surfaces of the first stack of MTJ layers, the second MTJ layers, the first SiON layer, and the second SiON layer, and the metal containing layer are coplanar.

18. The device of claim 17, wherein each of the first stack of MTJ layers and the second stack of MTJ layers consists of a reference layer, a tunnel barrier layer and a free layer.

19. The device of claim 16, wherein the first stack of MTJ layers has a upper portion having a first width and a lower portion having a second width that is different from the first width.

20. The device of claim 16, wherein the first stack of MTJ layers is part of a MRAM, a spin torque MRAM, or a spin torque oscillator structure.

* * * * *